United States Patent [19]
Coburn

[11] Patent Number: 5,313,499
[45] Date of Patent: May 17, 1994

[54] CONSTANT GAIN PHASE LOCK-LOOP

[75] Inventor: Ronald L. Coburn, Fuquay-Varina, N.C.

[73] Assignee: International Business Machines Corporation, Armonk, N.Y.

[21] Appl. No.: 875,879

[22] Filed: Apr. 29, 1992

[51] Int. Cl.⁵ .................. H04L 7/00; H04L 25/36; H04L 25/40; H03D 3/24
[52] U.S. Cl. .................. 375/110; 375/119; 375/120
[58] Field of Search ............. 375/110, 118, 119, 120; 331/17, 18, 25, 1 A

[56] References Cited

U.S. PATENT DOCUMENTS

| | | | |
|---|---|---|---|
| 4,167,711 | 9/1979 | Smoot | 331/25 |
| 4,745,372 | 5/1988 | Miwa | 331/17 |
| 4,803,705 | 2/1989 | Gillingham et al. | 375/111 |
| 5,126,692 | 6/1992 | Shearer et al. | 331/17 |
| 5,173,664 | 12/1992 | Petersen et al. | 331/17 |

FOREIGN PATENT DOCUMENTS

62-67989  3/1987  Japan.
2-284592  11/1990  Japan.

OTHER PUBLICATIONS

Patent Abstracts of Japan, 62-67989, Mar. 27, 1987.

Primary Examiner—Stephen Chin
Assistant Examiner—Duane Kobayashi
Attorney, Agent, or Firm—Joscelyn G. Cockburn

[57] ABSTRACT

A Phase Lock Loop (PLL) receives input signals from a local area network (LAN) and recovers data and clock signals therefrom. The PLL includes a charge pump which is responsive to pump-up or pump-down signals provided by a phase detector. A level determination circuitry scales the charge pump current in proportion to the time elapsing between transitions in the input signals. The charge pump, phase detector and level determination circuitry provide a constant average amps per radian gain and is insensitive to variations in the input signals.

6 Claims, 5 Drawing Sheets

CONSTANT GAIN PHASE LOCK-LOOP

BACKGROUND OF THE INVENTION

1. Field of the Invention

The present invention relates to communications networks in general and in particular to PLL for recovering data and clock signals from encoded electrical signals.

2. Prior Art

The prior art abounds with Phase Lock Loops (PLLs) which are used to recover clock and/or data embedded in run length code data signals. The PLLs may be used in recording devices to recover prerecorded information (data and/or clock) from a recording medium or in Data Terminal Equipments (DTES) to recover information transmitted over the transmission medium of a communications network.

A search of the prior art discloses the below-listed references. The first four references relate to PLL used in recording devices; while the remaining references relate to PLL used in DTEs.

U.S. Pat. No. 4,583,053 to Yarborough
U.S. Pat. No. 4,633,488 to Shaw
U.S. Pat. No. 4,737,866 to Ebata
U.S. Pat. No. 4,857,866 to Tateishi
U.S. Pat. No. 4,750,193 to Bailey
U.S. Pat. No. 4,803,705 to Gillingham et al
U.S. Pat. No. 4,847,874 to Kroeger et al
U.S. Pat. No. 4,908,841 to Leis et al
IBM ® TDB, Vol. 27, No. 12, May 1985 (pgs. 6988-6991).

The prior art suggests that a conventional PLL has three major functional units. The units are an oscillator (voltage or current controlled), a loop filter and a phase detector. The phase detector (PD) compares the output signals from the oscillator with input reference signals and outputs DC output signals proportional to the phase difference between compared signals. The DC output signals are passed through the loop filter to produce an average error signal which is used to control the frequency of the oscillator.

Several problems and solutions to them have been identified with the conventional PLL structure. Broadly classified, the problems include difficulty in locking the free running frequency of the oscillator to the frequency of the input reference signals, locking to harmonics or beat frequencies and locking within an optimum time period. The prior art has added a variety of electrical circuit arrangements to overcome specific identified problems. In some cases the identified problems are solved by simply rearranging the functional units and/or optimizing the components used in the units.

Even though the prior art addresses (i.e., identify and provide solutions) several of the problems associated with PLLs, none of them addresses the problem of variable gain. It is believed that variable gain is a major cause of instability in PLLs. Similar to other instability factors, variable gain causes jitter in the incoming signals. The jitter, in turn, makes it difficult to extract clocking signals from incoming signals and use of the clocking signals to synchronize the data.

The variable gain problem is particularly destructive to local area networks (LANs) such as the type espoused by IEEE 802.5, popularly called the token ring network. This type of LAN is well known in the prior art, therefore, only those features which make the LAN susceptible or sensitive to variable gain problems will be discussed further.

The token ring LAN is a serial network in which a large number of DTEs (also called stations) are connected to a looped transmission medium. Signal transmission is effectuated serially on the transmission medium. Thus, an active station (n) receives bits of a frame in a sequential fashion from its nearest active upstream neighbor (n−1) and retransmits the bits to its nearest active downstream neighbor (n+1). Because of the large number of stations sending (transmitting) and/or receiving frames from a common transmission medium any problem (such as loop gain variation, etc.) in one station accumulates and accentuates instability in the overall network. The problem is even more severe where the stations are provided by different manufacturers. Each manufacturer may set different loop gain variation standards which may not cause severe problems if all stations on the same loop are from the same manufacturer. However, by mixing stations from different manufacturers, the different standards could result in unacceptable loop gain variations.

The scheme used to encode data is another feature which makes the token ring LAN susceptible to variable loop gain. The well-known Manchester signalling technique is used to encode data on the token ring network. This signalling technique is selected because of its efficiency in transmitting both data and timing information in the same signal. In Manchester signalling techniques, different bit patterns are used to convey different types of information. It is believed that the variations in the data pattern also causes variation in the loop gain.

SUMMARY OF THE INVENTION

It is the main object of the present invention to provide a more efficient PLL than has heretofore been possible.

It is another object of the present invention to provide a constant gain PLL.

It is still another object of the invention to provide a PLL in which the gain is insensitive to variations in the data pattern.

These and other objects are achieved by providing a PLL in which the error signals, generated and used to align extracted clock signals with incoming data signals, are made a function of the elapsed time between pulses in the incoming signals.

More particularly, the PLL includes a phase detector circuitry, a charge pump, a loop filter, a level determination circuitry and a voltage control oscillator (VCO). The phase detector circuitry compares the incoming signals with recovered clock pulses, provided by the VCO, and outputs Pump Up (PUMPUP) and Pump Down (PUMPDOWN) signals which are applied to the charge pump. The level determination circuitry scales the charge pump current as a function of the time between phase samples. The charge pump in response to the scaled current and the Pump Up and Pump Down signals outputs charge pump signals, the magnitude of which are proportional to the time delay between pulse samples in the incoming signal. The charge pump signals are processed by the loop filter to form error signals which are applied to the input of the VCO.

DESCRIPTION OF THE PREFERRED EMBODIMENT

The present invention may be used to recover clock signals from any prerecorded data or signals transmitted over a communications network. It works well in recovering signals from the token ring network and, as such, will be described in that environment. However, this should not be construed as a limitation upon the scope of the invention since it is within the skill of one skilled in the art to apply the invention to other types of clock recovery systems without departing from the scope and/or spirit of the present invention.

Figure 1:
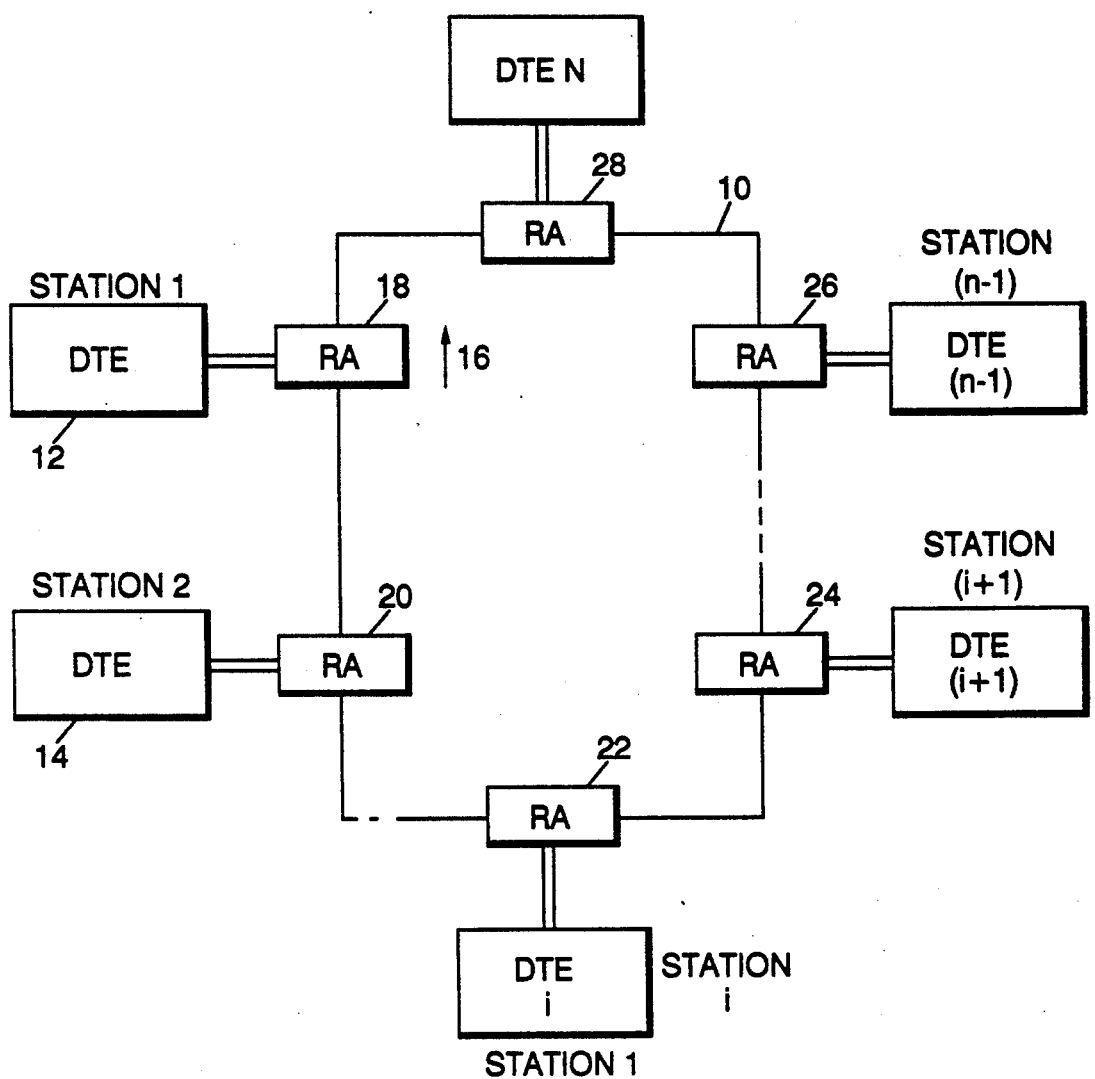
FIG. 1 is a block diagram of a communications network in which the present invention may be used.

FIG. 1 shows a serial loop communications system in which the present invention (to be described hereinafter) may be used. The serial ring communications system includes a closed loop unidirectional transmission media identified by numeral 10. The closed loop unidirectional transmission media interconnects a plurality of data terminal equipment (DTE) or data terminal units (DTU) 12, 14, ... I, I+1 ... N−1 and N. Each data terminal unit may include one or more devices such as display terminals, microcomputers, data collectors and telephone type apparatus, etc. The function of the system is to exchange or distribute data between these devices. Data transmission in the system is unidirectional and may be in the direction shown by arrow 16. The data terminal equipment is connected to the ring by ring adapter (RA) 18, 20, 22, 24, 26, 28 respectively. The structure and function of the ring adapters are identical; therefore, the description of one ring adapter is intended to cover all the adapters. The purpose of the ring adapter is to receive data from and transmit data onto the ring. To this end, the ring adapter performs ring protocol functions which enable the free movement of data on the ring without impacting the design of the data terminal equipment.

Still referring to FIG. 1, each data terminal equipment is connected to the ring through a ring adapter. As stated previously, data to and from the data terminal equipment is presented and extracted from the ring by the ring adapter. Incorporated in the ring adapter, is a circuit arrangement called a phase lock loop (PLL) which extracts clocking signals from received data according to the teachings of the present invention. The ring adapter and its connected data terminal equipment are hereinafter referred to as a station. For example, station 1 includes data terminal 12 and ring attachment or adapter 18. Likewise, station 2 includes data terminal equipment 14 and ring adapter 20, and so forth. Even though the ring adapter is shown as a separate unit from the data terminal equipment in FIG. 1, in reality, the adapter usually plugs into an expansion slot in a housing of the DTE which it connects to the ring. For example, the IBM token ring network PC adapter card plugs into an IBM PC expansion slot and interconnects the PC to the communications media.

Figure 2:
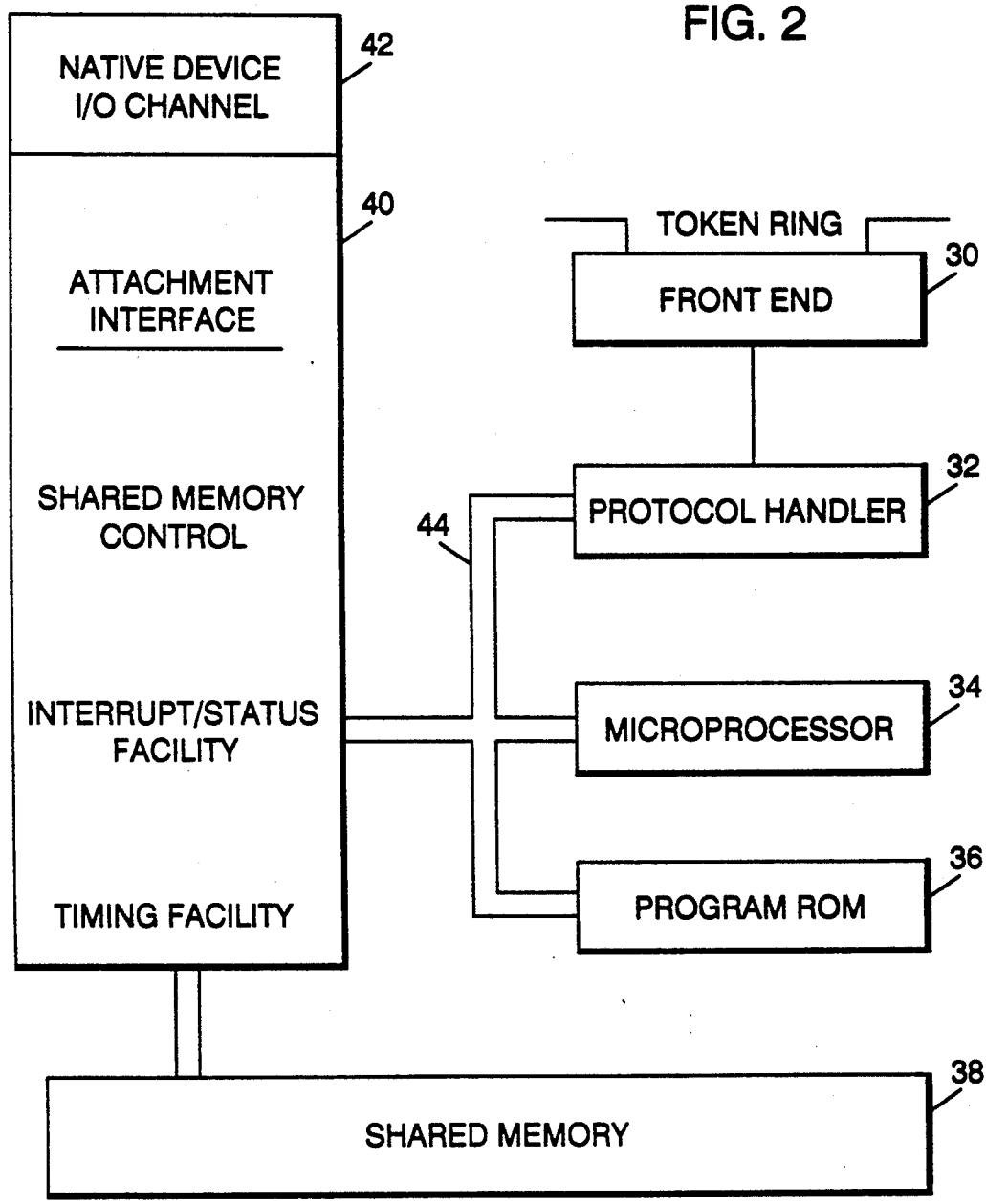
FIG. 2 is a functional block diagram of an adapter embodying the teachings of the present invention.

FIG. 2 shows a functional block diagram of the ring adapter. Each ring adapter transmits data onto the ring and receives data from the ring without intervention from the system which it attaches to the ring. For example, the adapter would be a hardware device in the first layer of the well-known open system interconnect (OSI) model. This model is a seven-layered model with the physical media attachment being the lowest (1) layer and the application programs being the highest (7) layer. The intermediate layers from low to high consists of data link, network, transport, session and presentation layers.

Still referring to FIG. 2, the ring adapter includes the following sections: front end 30, protocol handler 32, microprocessor 34, program ROM 36, shared memory 38, attachment interface 40, native device I/O channel 42 and internal bus structure 44. The internal bus structure 44 interconnects the attachment interface 40, protocol handler 32, microprocessor 34 and program ROM 36. The front end section 30 interfaces the adapter to the token ring. The front end section 30 is a grouping of electronic circuits which performs electrical signals conversion on data which is slated for transmission onto the ring and data which is received from the ring. The front end section 30 performs such function as signal conversion including modulation and demodulation. Likewise, the front end 30 includes the phase lock loop (details to be given hereinafter) which extracts the clocking signal from Manchester encoded data received from the ring. The recovered clock is used for reclocking data through the adapter to the native device I/O channel 42. The recovered clock is also used to reclock data for retransmission onto the ring. The protocol handler is interconnected to the internal system bus 44 and front end 30. The protocol handler 32 is a grouping of digital circuitry which performs bit and byte level functions. These functions include encoding and decoding data, handling token protocols according to the IEEE 802.5 standards, generating and detecting delimiters, generating and checking cyclic redundant check (CRC) decoding addresses, etc. The microprocessor 34 and program ROM 36 are the controller for the adapter. The microprocessor is controlled according to the stored program in program ROM 36.

The attachment interface 40 and shared RAM 38 provide working memory for the microprocessor and the facility through which information is exchanged between the adapter and the device which the adapter attaches to the LAN. To this end, data for the native device which the adapter attaches is placed into shared RAM 38. Likewise, data from the device which is to be transmitted onto the ring is placed in share RAM 38. Attachment interface 40 interconnects the shared RAM to the native device I/O channel 42. The attachment interface 40 includes a shared memory control means interrupt/status facility and timing facility. The function of these facilities is to insure smooth transmission of data from the native device I/O channel 40 to the shared memory 38 or smooth transmission from the shared memory to the native device. Stated another way, the facilities allow communication between shared memory 38 and the adapter.

In operation, when a message is received from another station on the loop, the protocol handler in the receiving station strips off the portion of the message which has value to the lower level layers (called MAC layers) of the adapter. The message is then placed in the shared RAM 38. The microprocessor then utilizes the interrupt facility to inform the native device that information or a message is in the shared memory. The native device at its own leisure then accesses the shared memory to remove the data. Likewise, data for the adapter to output on the network is placed in the shared memory. The microprocessor is notified and in time removes the data to the protocol handler where ring control information is added and the frame is outputted on the network. It should be noted that any access to the network requires that the adapter has a token which gives it the right to transmit data onto the network.

A more detailed discussion of the adapter shown in FIG. 2 is given in U.S. Pat. No. 4,507,777 and a manual entitled "Technical Reference Token Ring network PC Adapter", form #69X7862.

Figures 3, 3A:
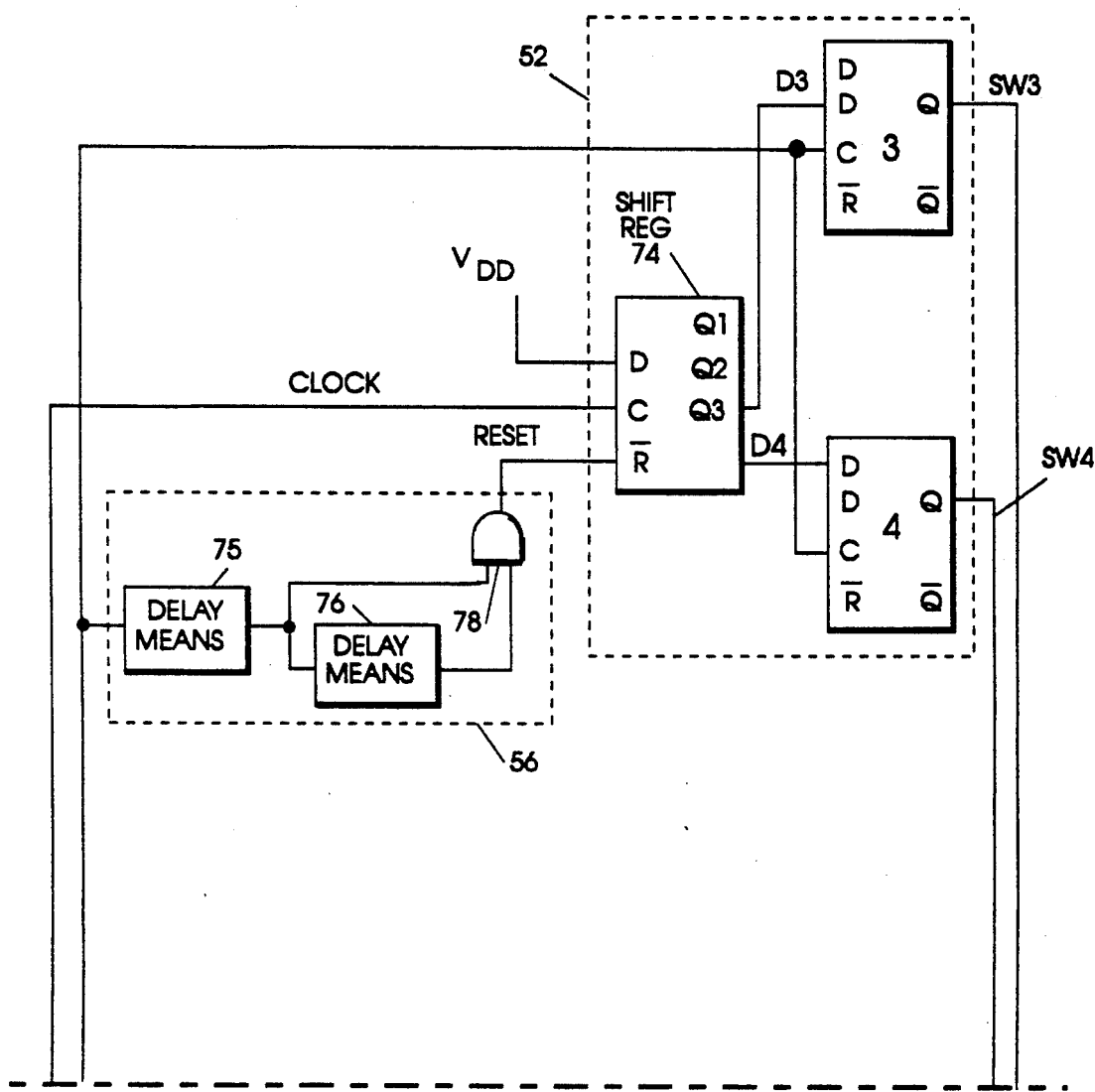
FIGS. 3A and 3B show a circuit diagram of the constant gain PLL according to the teachings of the present invention.
Figure 3B:
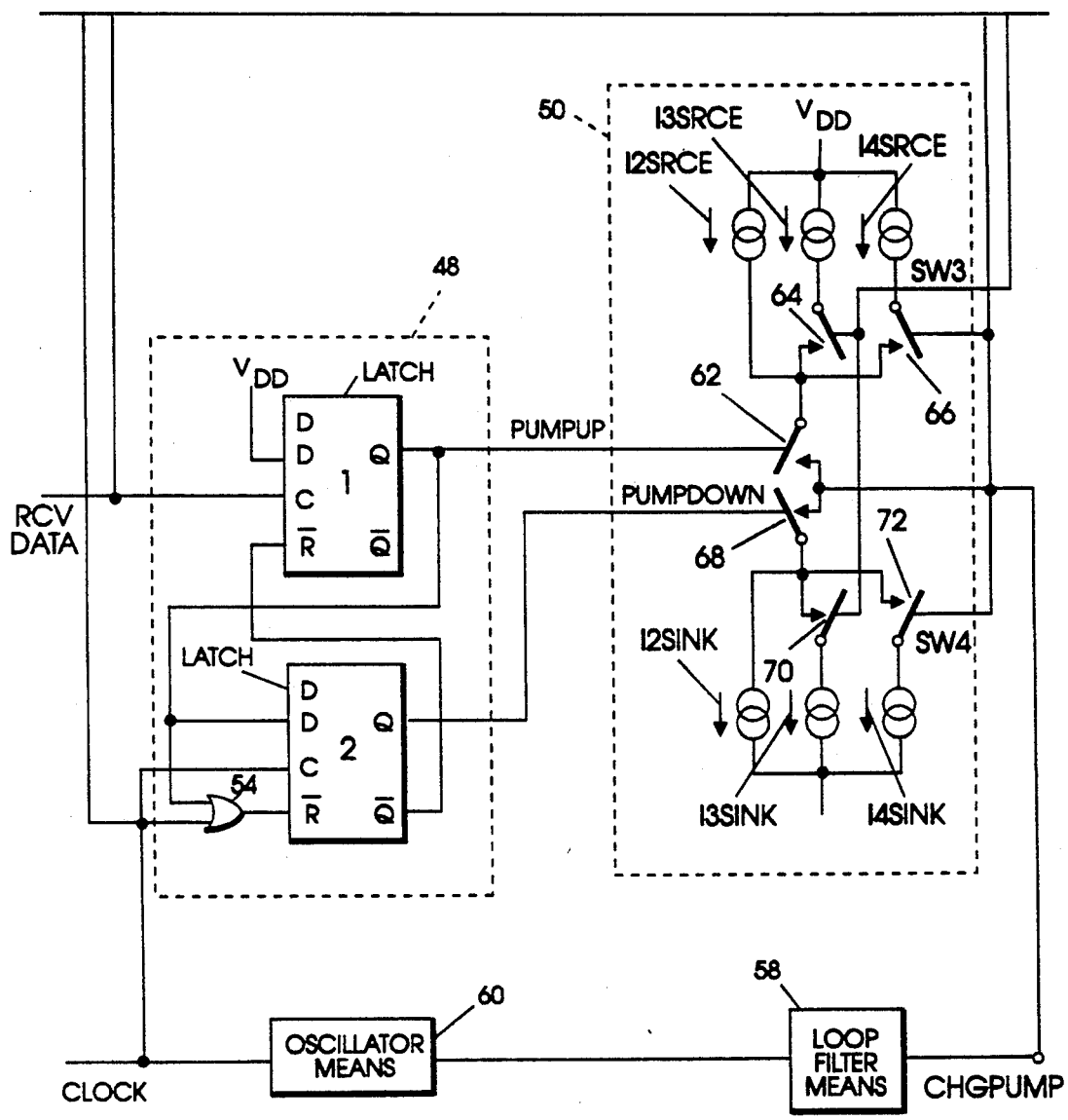

FIG. 3 shows a phase lock loop according to the teachings of the present invention. The phase lock loop is positioned in the front end section 30 (FIG. 2). Its function is to recover clock signals present in Manchester encoded information received from the token ring. The extracted clock signals are used to retime frames retransmitted on the ring or to retime frames through the adapter into the shared memory 38. The structure of the phase lock loop is such that the gain of the loop is constant and is not disturbed by changes in the Manchester encoded data pattern received from the token ring.

Still referring to FIG. 3, the phase lock loop includes phase detector 48, charge pump means 50, level determination circuitry 52, reset logic means 56, loop filter means 58 and oscillator means 60. The output of the phase detector 48 is connected to the input of charge pump means 50. The level determination circuitry 52 scales the charge pump current as a function of the time which elapses between input signal samples. As a result, the amplitude of the signal at the output node (CHGPUMP) of the charge pump varies as a function of elapsed time between pulses in the input signal. The scaled signal at the charge pump output node (CHG PUMP) is fed into loop filter 58 which converts the signal at the charge pump output node to an error signal which controls the frequency of the oscillator means 60 so that the output clock falls in phase with the input receive data. Preferably, the oscillator means 60 can be a voltage control oscillator (VCO) or a current control oscillator. Also, the loop filter means 58 can be a simple resistor interconnecting the charge pump output node to ground or an elaborate circuit such as an integrator, etc.

Still referring to FIG. 3, the phase detector 48 includes D-latch 1 and D-latch 2. The D-latch 1 outputs a pump-up (PUMPUP) signal on its Q output terminal and D-latch 2 outputs a pump-down (PUMPDWN) signal on its Q output terminal. The terminal labeled C of D-latch 1 is connected to the receive data input node (RCVDATA). The terminal labeled D of the D-latch 1 is connected to a voltage supply node labeled VDD. The reset (R) terminal of D-latch 1 is connected to ($\overline{Q}$) the output of D-latch 2. Similarly, the Q output terminal of D-latch 1 is connected to the D input terminal of D-latch 2 and to one input of OR circuit means 54. The other input of OR circuit means 54 is connected to the oscillator means 60. It carries the clock line. The clock line is the clock which is extracted from the receive data. The clock line is also connected to the C input of D-latch 2.

Still referring to FIG. 3, charge pump means 50 includes a plurality of current sources and a plurality of current sinks. The current sources are labeled I2SRCE, I3SRCE and I4SRCE. Likewise, the current sinks are labeled I2SINK, I3SINK and I4SINK. The current source I2SRCE is connected through switch means 62 to the output node of the charge pump labeled CHG PUMP. In addition, switch means 64 and 66 interconnect current sources I3SRCE and I4SRCE to switch means 62. As will be explained subsequently, depending upon the number of switches closed, the magnitude of the charge pump current in the pump-up cycle can be adjusted (i.e., decrease or increase). Similarly, switch means 68 interconnects the pump-down output of D-latch 2 to the charge pump output (CHGPUMP). A plurality of current sinks labeled I2SINK, I3SINK and I4SINK are interconnected through switching means 70 and 72, respectively, to switch means 68 which, in turn, is connected to the charge pump output. As will be explained subsequently, when the pump-down signal is activated and switch means 68 is closed, the magnitude of the pump-down current at the charge pump output can be adjusted accordingly. The magnitude of the adjustment depends on whether switch 70 or 72 is closed. Thus, with the charge pump shown and the appropriate switch signal enabled, the magnitude of the current at the output of the charge pump can be adjusted. This feature of dynamically adjusting the pump-up pump-down current of the charge pump makes the gain of the phase lock loop insensitive to variation in the data pattern. The feature is not provided in prior art phase lock loops.

Still referring to FIG. 3, the function of the level determination circuitry 52 is to monitor the input data and to determine the time which elapsed between incoming pulses and adjust the current (sink or source) in the charge pump to be a function of the elapsed time. To this end, the level determination circuitry 52 includes shift register means 74 with selected output connected to D-latch 3 and D-latch 4. Depending on the count in the shift register 74, the output Q3 when activated causes a signal S3 on the Q output of D-latch 3. The signal is used for controlling switch means 64 and 70 respectively. Similarly, when the Q4 output of shift register 74 is active, D-latch 4 is set and its output SW4 controls switch 72 and 66 respectively. A reset means 56 comprised of connected delay means 75, 76 and AND circuit means 78 generate a reset pulse which is applied to the R terminal of the shift register. As stated previously, depending on the signal at the charge pump output, loop filter means 58 changes it into an error signal which drives the oscillator means to adjust the output pulse so that it is aligned with pulses in the incoming data stream.

Figure 4:
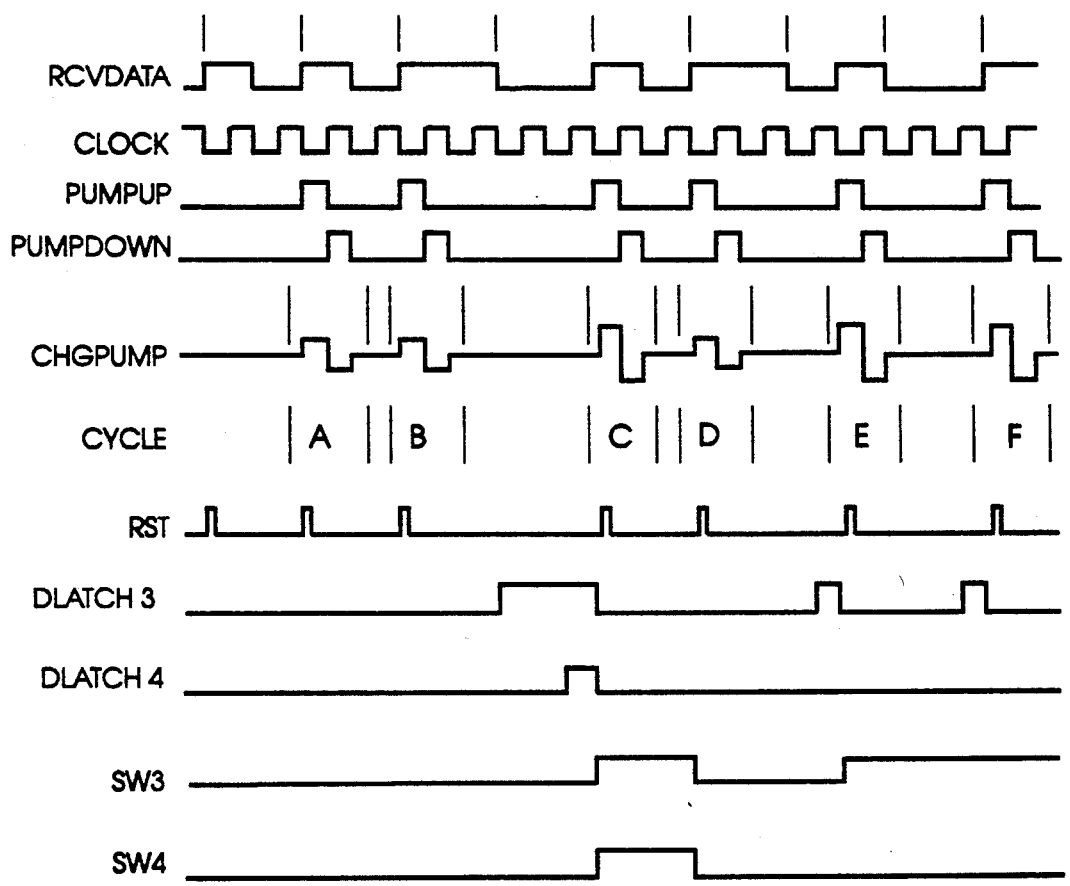
FIG. 4 shows timing diagrams of the constant gain PLL.

FIG. 4 shows a timing diagram of the constant gain phase lock loop. It is helpful in understanding the operation of the present invention. In order to correlate the timing diagram in FIG. 4 with the constant gain phase lock loop circuitry (FIG. 3), common names are used to identify the signal and the point at which they appear in FIG. 3. For example, if the line labeled receive data (RCVDATA) in FIG. 3 were to be scoped, then the pulse train labeled receive data (RCVDATA) in FIG. 4 would be observed. The other named pulse trains in FIG. 4 would be observed if viewed at the point in FIG. 3 having the same name.

The operation of the constant gain phase lock loop will now be made with reference to the timing diagram in FIG. 4. It should be noted that the reset (RST) signal which resets the shift register is delayed until data is latched into D-latch 3 and D-latch 4. Also, the magnitude of the signal labeled CHG PUMP is a function of the count occurring between pulse samples. Each pump cycle includes a pump-up and a pump-down signal. Therefore, the count which occurs between the pulses for pump cycle A and pump cycle B is the same since the amplitude of these two pulses are identical. The count which is accumulated between data samples for pump cycle C is greater than the count occurring between pump cycle for either pump cycle A or B. Similarly, the count occurring between pulse for pump cycle E and F is equal and is greater than the count occurring between pulses for pump cycle D. In essence, the magnitude of the charge pump signal is adjusted according to the magnitude of counts occurring between the pulses. The magnitude of the pump cycle current is controlled by the respective switches and the current source which is allowed to cause current to flow (that is, source current) into the node CHG PUMP or sink current from the node CHG PUMP.

Still referring to FIG. 3 and the timing diagram of FIG. 4, a phase error sample is only initiated when a positive transition of RCV DATA occurs. When RCV DATA and a clock are in perfect alignment, the falling clock transition does not turn off the pump-up pulse due to a finite logic delay through the phase error circuit. Thus, the pump-up pulse is ½ the clock period for this case. This eliminates jitter due to asymmetry of data pulses. When a sample is initiated, the output pump-up is set high. This output is high until a falling clock transition occurs. Simultaneously, with a pump-up going low, pump-down goes high. The pump-down is always ½ of a clock period long. The pump-up is the only width that is modulated by phase error between the rise of receive data and the fall of clock. The pump-up can vary between 0 and a full clock period.

In order to describe the charge pump logic, it is assumed that the shift register is cleared (that is, the contents of the shift register is a logical 0). Each positive clock transition will set a 1 in the Q1 position and advance the state of each output to the next higher position. Thus, if two or less transitions occur before the next phase sample (positive receive data transition), the Q output (labeled SW3) of latch 3 and the Q output (labeled SW4) of D-latch 4 will be 0. The resulting output current for the charge pump will be I2SRCE and I2SINK. If three transitions are counted, the Q output (labeled SW3) of D-latch 3 will be active (i.e., a logical 1). With SW3 active, the resulting output current is then set at I2SRCE plus I3SRCE and I2SINK plus I3SINK. For four transitions, the output current will be I2SRCE plus I3SRCE plus I4SRCE and I2SINK plus I3SINK plus I4SINK. It should be noted that for four transitions, switches 64, 66, 62, 68, 70 and 72 are closed.

The benefit of the phase lock loop is that it provides true constant gain per radian over all data patterns. The phase lock loop has constant gain and bandwidth, it simplifies loop compensation for stability and allows minimum separation of the lead-lag zero and pole required for second order phase lock loops.

While the invention has been particularly shown and described with reference to the preferred embodiments thereof, it will be understood by those skilled in the art that various changes in form and detail may be made therein without departing from the spirit and scope of the invention.

What is claimed is:

1. An improved phase lock loop (PLL) circuitry for extracting clock pulses from Manchester encoded signals packaged in frames according to 802.5 IEEE standard for token ring and using said clock pulses for gating data in said Manchester encoded signals comprising:
    a first circuit means for correlating the Manchester encoded signals from a communications network with clock pulses and to output a first control signal and a second control signal representative of misalignment between said incoming Manchester encoded signals and said clock pulses;
    a second circuit means for generating at its output a quantum of current in response to the first control signal or the second control signal;
    said second circuit means including a first section having at least three current supply sources with each current supply source having one terminal connected to a common supply voltage source, a second terminal of one of said three current sources connected to a first common node, a first switch means coupling a second one of the three current supply sources to the first common node;
    a second switch means coupling the third one of the current supply sources to the first common node, and
    a second section having at least three current sink sources with each current sink sources having one terminal connected to a common voltage level, a second terminal of a first one of the three current sink sources connected to a second common node, a third switch means coupling a one of the three current sink sources coupled to the second common node, a fourth switch means coupling a third one of the three current sink sources to the second common node, a fourth switch means coupling the first common node to an output node and a fifth switch means coupling the second common node to the output node;
    a first D latch circuitry having a Q output terminal coupled to selected switch means in the first section and the second section and a second D latch circuitry having a Q output terminal coupled to selected switch means in the first section and the second section; with each D latch circuitry having a D input and a C input;
    a shift register means having selected ones of its outputs connected to the D input of each D latch circuitry; and a
    reset means connected to an R input of said shift register means
    a loop filter means for receiving scaled quantums of current from the second circuit means and for generating error signals therefrom; and
    a fourth circuit means generating the clock pulses in response to the error signals.

2. The improved PLL of claim 1 wherein the first circuit means includes a phase detector circuit.

3. The improved PLL of claim 2 wherein the phase detector circuit includes a first D latch circuitry and a second D latch circuitry, with each D latch circuitry having outputs Q and $\overline{Q}$ and inputs R, C and D;
    an "OR" circuit means having its output connected to an R input of one of the D latch circuitry, a first input connected to a C input of said one of the D latch circuitry and to receive the clock pulses and a second input connected to a D input of said one of the D latch circuitry and to a Q output of another one of said D latch circuitry; and a conductor means interconnecting an R input of said another one of said D latch circuitry with a $\overline{Q}$ output of said one of the D latch circuitry.

4. The improved PLL of claim 1 wherein the reset means include a first and a second delay means connected in tandem; and an "AND" circuit means having its output connected to an "R" input of said shift register means and each one of its two inputs connected to separate ones of the first and second delay means.

5. The improved PLL of claim 1 wherein the fourth circuit means includes a voltage controlled oscillator (VCO).

6. An improved adapter for coupling a DTE to a LAN comprising:

a front end means for coupling the adapter to the LAN; said front end means including a phase detector for correlating input Manchester signals packaged in frames according to 802.5 IEEE standards for token ring from said LAN with clock signals and to generate pump-up and pump-down signals, charge pump means coupled to receive the pump-up and pump-down signals said charge pump means including a first section having at least three current supply sources with each current supply source having one terminal connected to a common supply voltage source, a second terminal of one of said three current sources connected to a first common node, a first switch means coupling a second one of the three current supply sources to the first common node;

a second switch means coupling the third one of the three current supply sources to the first common node, and a second section having at least three current sink sources with each current sink source having one terminal connected to a common voltage level, a second terminal of a first one of the three current sink sources connected to a second common node, a third switch means coupling a second one of the three current sink sources to the second common node, a fourth switch means coupling a third one of the three current sink sources to the second common node, a fourth switch means coupling the first common node to an output node and a fifth switch means coupling the second common node to the output node and a level determination circuitry coupled to the charge pump; said level determination circuitry including a shift register means responsive to clock pulses extracted from the Manchester encoded signals packed in frames according to 802.5 IEEE standards for token ring to generate control signals which cause the charge pump current to be scaled as a function of the time delays between phase samples;

a protocol handler coupled to the front end means; said protocol handler formatting data to conform with protocol or architecture requirements on the LAN;

a microprocessor for controlling the adapter;

an interface means for coupling the adapter to an I/O channel of the DTE which the adapter connects to the LAN; and bus means for interconnecting the microprocessor, the protocol handler and the interface means.

* * * * *